US012809277B2

(12) United States Patent
Thissen et al.

(10) Patent No.: US 12,809,277 B2
(45) Date of Patent: Nov. 24, 2026

(54) ALIGNMENT METHOD AND ASSOCIATED ALIGNMENT AND LITHOGRAPHIC APPARATUSES

(71) Applicant: ASML NETHERLANDS B.V., Veldhoven (NL)

(72) Inventors: Nick Franciscus Wilhelmus Thissen, Eindhoven (NL); Leendert Jan Karssemeijer, 's Hertogenbosch (NL)

(73) Assignee: ASML NETHERLANDS B.V., Veldhoven (NL)

( * ) Notice: Subject to any disclaimer, the term of this patent is extended or adjusted under 35 U.S.C. 154(b) by 114 days.

(21) Appl. No.: 18/276,420

(22) PCT Filed: Feb. 11, 2022

(86) PCT No.: PCT/EP2022/053333
§ 371 (c)(1),
(2) Date: Aug. 8, 2023

(87) PCT Pub. No.: WO2022/184405
PCT Pub. Date: Sep. 9, 2022

(65) Prior Publication Data

US 2024/0118631 A1 Apr. 11, 2024

(30) Foreign Application Priority Data

Mar. 2, 2021 (EP) .................................... 21160224

(51) Int. Cl.
*G03F 9/00* (2006.01)
*G03F 7/00* (2006.01)

(52) U.S. Cl.
CPC ........ *G03F 9/7046* (2013.01); *G03F 7/70633* (2013.01); *G03F 7/706837* (2023.05)

(58) Field of Classification Search
CPC ............. G03F 7/70616; G03F 7/70633; G03F 7/706837; G03F 9/7046
See application file for complete search history.

(56) References Cited

U.S. PATENT DOCUMENTS 6,961,116 B2 11/2005 Den Boef et al.
10,241,426 B2 3/2019 Tinnemans
(Continued)

FOREIGN PATENT DOCUMENTS

CN 108027571 5/2018
CN 111095114 5/2020
(Continued)

OTHER PUBLICATIONS

International Search Report and Written Opinion issued in corresponding PCT Patent Application No. PCT/EP2022/053333 dated Apr. 11, 2022.
(Continued)

*Primary Examiner* — Deoram Persaud
(74) *Attorney, Agent, or Firm* — Pillsbury Winthrop Shaw Pittman, LLP

(57) ABSTRACT

A method for determining a set of correction weights to correct metrology data. The method includes obtaining first metrology data relating to a plurality of illumination settings of measurement radiation used to perform a measurement, where each illumination setting includes a different wavelength, polarization or combination thereof; fitting the metrology data to a model for representing the metrology data and determining fit residuals; and determining the correction weights as correction weights which minimize the fit residuals.

20 Claims, 3 Drawing Sheets

(56) References Cited

U.S. PATENT DOCUMENTS

| | | | |
|---|---|---|---|
| 10,401,739 B2 | 9/2019 | Geypen | |
| 2006/0033921 A1 | 2/2006 | Den Boef et al. | |
| 2006/0066855 A1 | 3/2006 | Den Boef et al. | |
| 2009/0195768 A1 | 8/2009 | Bijnen et al. | |
| 2010/0201963 A1 | 8/2010 | Cramer et al. | |
| 2011/0027704 A1 | 2/2011 | Cramer et al. | |
| 2011/0043791 A1 | 2/2011 | Smilde et al. | |
| 2011/0102753 A1 | 5/2011 | Van De Kerkhof et al. | |
| 2011/0134419 A1* | 6/2011 | Fuchs | G01N 21/956 356/237.5 |
| 2012/0044470 A1 | 2/2012 | Smilde et al. | |
| 2012/0123581 A1 | 5/2012 | Smilde et al. | |
| 2013/0050668 A1* | 2/2013 | Kisteman | G03F 7/70625 355/55 |
| 2013/0258310 A1 | 10/2013 | Smilde et al. | |
| 2013/0271740 A1 | 10/2013 | Quintanilha | |
| 2014/0065736 A1 | 3/2014 | Amir et al. | |
| 2014/0270459 A1* | 9/2014 | Moll | G06T 7/269 427/256 |
| 2015/0227061 A1* | 8/2015 | Tinnemans | G03F 9/7069 356/509 |
| 2015/0261097 A1 | 9/2015 | Mathijssen et al. | |
| 2015/0355554 A1 | 12/2015 | Mathijssen | |
| 2019/0094721 A1 | 3/2019 | Tinnemans et al. | |
| 2019/0107781 A1 | 4/2019 | Tinnemans et al. | |
| 2019/0137892 A1* | 5/2019 | Cekli | H01L 22/12 |
| 2019/0155173 A1 | 5/2019 | Tsiatmas et al. | |
| 2020/0110332 A1 | 4/2020 | Lee et al. | |
| 2022/0121128 A1* | 4/2022 | Goorden | G03F 7/70633 |
| 2024/0094643 A1* | 3/2024 | Alpeggiani | G03F 7/70641 |
| 2024/0184221 A1* | 6/2024 | Rehman | G03F 9/7046 |
| 2024/0263941 A1* | 8/2024 | Cheng | G01B 11/272 |
| 2024/0377761 A1* | 11/2024 | Kuzucu | G02B 5/1828 |

FOREIGN PATENT DOCUMENTS

| | | |
|---|---|---|
| WO | 2009078708 | 6/2009 |
| WO | 2009106279 | 9/2009 |
| WO | 2013178422 | 12/2013 |
| WO | 2015051970 | 4/2015 |
| WO | 2017032534 | 3/2017 |
| WO | 2017060054 | 4/2017 |
| WO | 2019001871 | 1/2019 |

OTHER PUBLICATIONS

J. Bechhoefer, “Kramers-Kronig, Bode, and the meaning of zero”, American Journal of Physics 79(10), pp. 1053-1059 (2011).

K. Bhattacharyya et al., “A study of swing-curve physics in diffraction-based overlay”, Proc. of SPIE, vol. 9778, pp. 1-7 (2016).

J. Lucas et al., “A fast Fourier transform implementation of the Kramers-Kronig relations: Application to anomalous and left handed propagation”, AIP Advances 2, 032144, pp. 1-11 (2012).

B. Menchtchikov et al., “Reduction in overlay error from mark asymmetry using simulation, Orion, and alignment models”, Proc. of SPIE, vol. 10587, pp. 1-10 (2018).

Office Action issued in corresponding Chinese Patent Application No. 202280018266.1, dated May 7, 2026.

* cited by examiner

ALIGNMENT METHOD AND ASSOCIATED ALIGNMENT AND LITHOGRAPHIC APPARATUSES

CROSS-REFERENCE TO RELATED APPLICATIONS

This application is the U.S. national phase entry of PCT Patent Application No. PCT/EP2022/053333 which was filed on Feb. 11, 2022, which claims priority of European Patent Application No. 21160224.8 which was filed on Mar. 2, 2021, and which is incorporated herein in its entirety by reference.

FIELD OF THE INVENTION

The present invention relates to methods and apparatus usable, for example, in the manufacture of devices by lithographic techniques, and to methods of manufacturing devices using lithographic techniques. The invention relates to metrology devices, and more specifically metrology devices used for measuring position such as alignment sensors and lithography apparatuses having such an alignment sensor.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as “fields”.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor or alignment sensor (both terms are used synonymously), typically an optical position sensor.

The lithographic apparatus includes one or more alignment sensors by which positions of marks on a substrate can be measured accurately. Different types of marks and different types of alignment sensors are known from different manufacturers and different products of the same manufacturer. A type of sensor widely used in current lithographic apparatus is based on a self-referencing interferometer as described in U.S. Pat. No. 6,961,116 (den Boef et al). Various enhancements and modifications of the position sensor have been developed, for example as disclosed in US2015261097A1. The contents of all of these publications are incorporated herein by reference.

Imperfections in alignment marks can result in a wavelength/polarization dependent variation in a measured value from that mark. As such, correction and/or mitigation for this variation is sometimes effected by performing the same measurement using multiple different wavelengths and/or polarizations (or more generally, multiple different illumination conditions). It would be desirable to improve one or more aspects of measuring using multiple illumination conditions.

SUMMARY OF THE INVENTION

The invention in a first aspect provides a method for determining a set of correction weights to correct metrology data; the method comprising: obtaining first metrology data relating to a plurality of illumination settings of measurement radiation used to perform a measurement, where each illumination setting comprises a different wavelength, polarization or combination thereof; fitting the metrology data to a model for representing the metrology data and determining the fit residuals; and determining said correction weights as correction weights which minimize the fit residuals.

Also disclosed is a computer program, alignment sensor and a lithographic apparatus being operable to perform the method of the first aspect.

The above and other aspects of the invention will be understood from a consideration of the examples described below.

BRIEF DESCRIPTION OF THE DRAWINGS

Embodiments of the invention will now be described, by way of example only, with reference to the accompanying drawings, in which.

DETAILED DESCRIPTION OF EMBODIMENTS

Before describing embodiments of the invention in detail, it is instructive to present an example environment in which embodiments of the present invention may be implemented.

Figure 1:
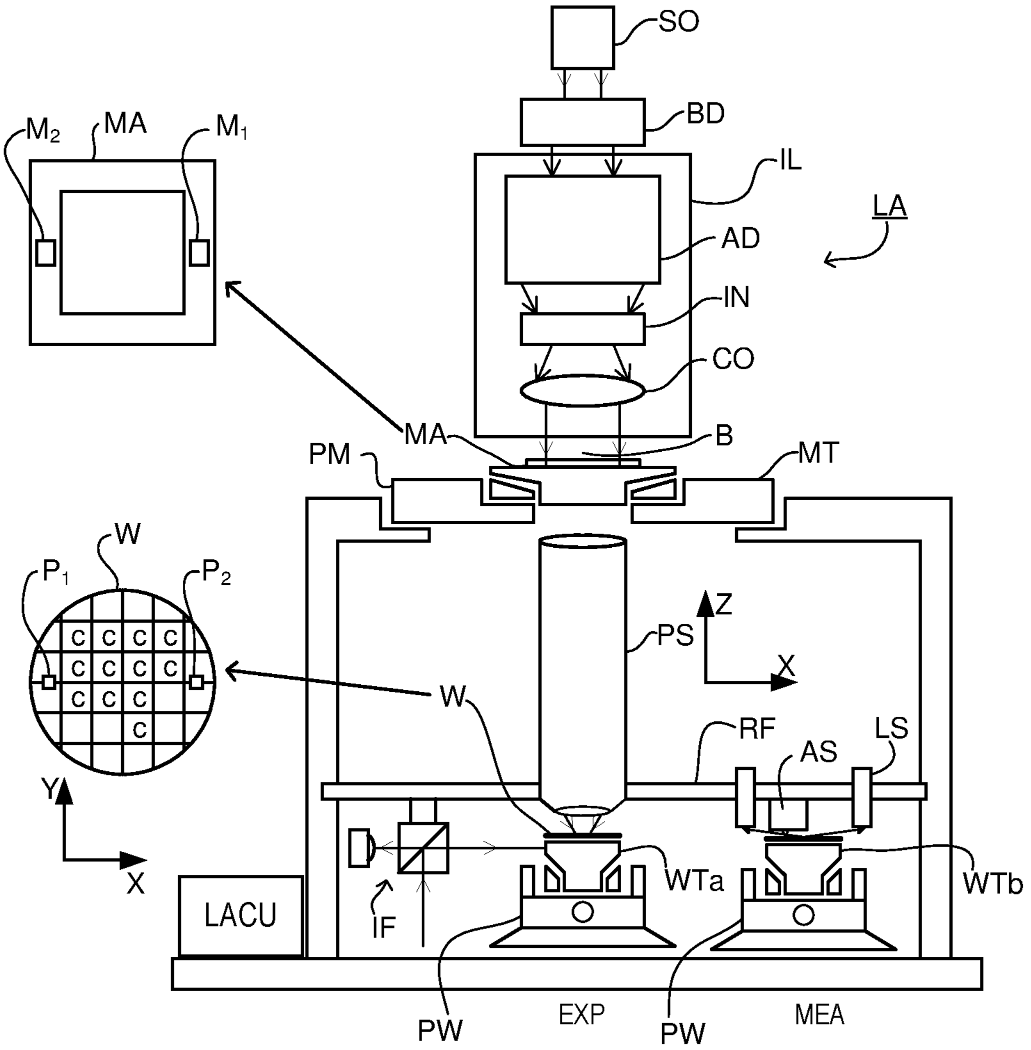
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
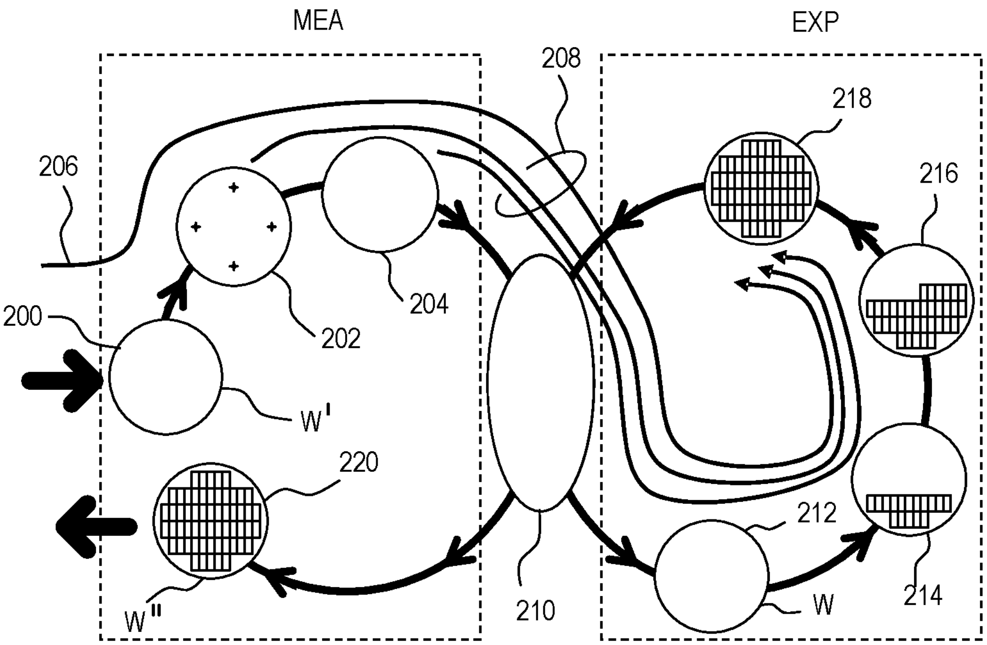
FIG. 2 illustrates schematically measurement and exposure processes in the apparatus of FIG. 1.

FIG. 2 illustrates the steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. Advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

The skilled person will know that the above description is a simplified overview of a number of very detailed steps involved in one example of a real manufacturing situation. For example rather than measuring alignment in a single pass, often there will be separate phases of coarse and fine measurement, using the same or different marks. The coarse and/or fine alignment measurement steps can be performed before or after the height measurement, or interleaved.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in US2009/195768A, which is incorporated by reference.

The alignment sensor scans each mark optically with a spot of radiation to obtain a periodically varying signal, such as a sine wave. The phase of this signal is analyzed, to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

Measuring the position of the marks may also provide information on a deformation of the substrate on which the marks are provided, for example in the form of a wafer grid. Deformation of the substrate may occur by, for example, electrostatic clamping of the substrate to the substrate table and/or heating of the substrate when the substrate is exposed to radiation.

Figure 3:
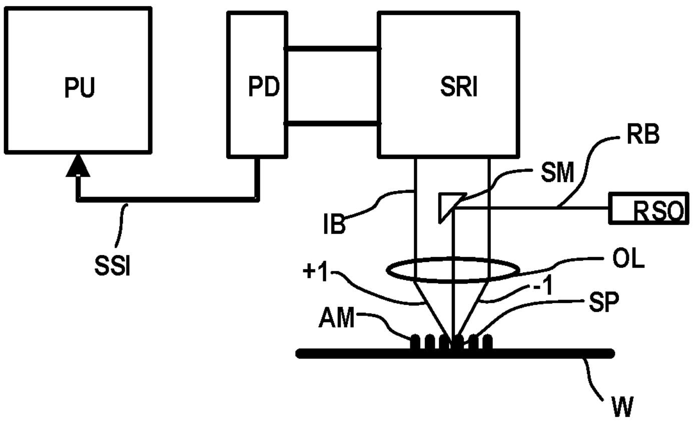
FIG. 3 is a schematic illustration of an alignment sensor adaptable according to an embodiment of the invention.

FIG. 3 is a schematic block diagram of an embodiment of a known alignment sensor AS. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark AM is collimated (in this example via the objective lens OL) into an information-carrying beam IB. The term "diffracted" is intended to include complementary higher diffracted orders; e.g.: +1 and −1 diffracted orders (labelled +1, −1) and optionally zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

SRI Intensity signals SSI are supplied to a processing unit PU. By a combination of optical processing in the self-referencing interferometer SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels are repeated at different wavelengths for increased accuracy and/or for robust detection of the mark irrespective of the materials from which the mark is made, and materials on and/or below which the mark is provided. Improvements in performing and processing such multiple wavelength measurements are disclosed below.

In the context of wafer alignment, the following approaches are in use or have been proposed to correct the mark position for mark asymmetry (asymmetry in the alignment mark which results in a position error or offset): OCW (Optimal Color Weighing—described in more detail in US publication US2019/0094721 A1 which is incorporated herein by reference), OCIW (Optimal Color and Intensity Weighing—described in more detail in PCT publication WO 2017032534 A2) and WAMM (Wafer Alignment Model Mapping—described in more detail in PCT publications WO 2019001871 A1 and WO 2017060054 A1).

Using the example of OCW, in OCW a least squares optimization is performed on alignment model fit coefficients X, in terms of a set of weights $\overline{w}$ comprising a weight for each of the colors. These weights $\overline{w}$ are considered optimal when they minimize the difference between alignment and overlay metrology $\overline{y}$; i.e., the optimization finds the weights $\overline{w}$ which best satisfies:

$$X\overline{w}=\overline{y}$$

In each of these prior art methods, training to reference overlay data is needed or desired. Other methods may rely on specific assumptions being made on the spatial distribution of the mark-deformation over the wafer. This means that these corrections can only be accurately performed if sufficient reference data is available and if the process variations in the reference data are representative of the variations that need to be corrected. This reference data may be measured by a reference sensor, e.g. hindsight overlay data, such as used in the OCW example just presented. This overlay metrology data is used as a reference in feedback mode: after a wafer has been exposed, the resultant measurement error is observed in hindsight via overlay metrology and corrected for in a future exposure.

There are important drawbacks to using overlay metrology in this way. For example, overlay metrology is expensive, not all exposed wafers are typically measured, measurements take place a relatively long time after exposure such that corrections may be out-of-date by the time they are applied, and overlay metrology also suffers from very similar mark deformation errors and is therefore an imperfect reference.

It is therefore proposed to correct mark asymmetry using only alignment data, e.g., without relying on overlay metrology feedback. The proposed method is based on an observed correlation between wafer alignment model residuals (the difference between measured alignment data and the alignment model fitted to the alignment data) and overlay performance. Due to mark asymmetry, each color measures a slightly different wafer shape, and the color which best fits the model may be chosen as the recipe color. This concept may be extended to determine a color weighting for multiple colors, in a manner similar to OCW, but without reliance on reference overlay data. For the avoidance of doubt, all references to "a color" in this disclosure should be understood to encompass (and be shorthand for) a particular wavelength and polarization combination.

The proposed method comprises determining color weights $w^{(n)}$ for colors n (of a total number of colors N) which, when applied to measured alignment data $x_{meas}^{(n)}$ (respective measured position for each color), yields the correct aligned position x:

$$x = \sum_{n=1}^{N} w^{(n)} x_{meas}^{(n)}$$

and to which an additional constraint may be imposed, that the sum of color weights equals 1:

$$\sum_{n=1}^{N} w^{(n)} = 1$$

The goal of the proposed method is to determine a set of color weights which minimizes the alignment model residuals, such that the color weighted positions have lower (or at least the same) model residuals compared to the single-color measured position. The specific illustrative method described below determines this set of color weights by performing a linear least squares optimization of the model residuals for each measurement. However, it should be appreciated that this is only one optimization option and alternative optimization methods may be performed instead. For instance by including a regularization term in the optimization based on an L1 norm.

The method comprises obtaining alignment data comprising per-color alignment values (i.e., there are multiple alignment values, one per color, for each alignment mark). The model residuals may be calculated on each alignment mark (total M marks) and for each color (total N colors) by fitting the measurements per color with an alignment model, and recording the fit residuals. The alignment model may be any suitable alignment model used for alignment modeling. The fit residuals can be represented as a residual matrix R, with each element comprising a residual $r_m^{(n)}$ on alignment mark index m (where m=1 to M) and color channel n (where n=1 to N):

$$R = \begin{bmatrix} r_1^{(1)} & r_1^{(2)} & \cdots & r_1^{(N)} \\ r_2^{(1)} & r_2^{(2)} & \cdots & r_2^{(N)} \\ r_3^{(2)} & r_3^{(2)} & \cdots & r_3^{(N)} \\ \vdots & \vdots & \ddots & \vdots \\ r_M^{(1)} & r_M^{(2)} & \cdots & r_M^{(N)} \end{bmatrix}$$

The residuals may be calculated over multiple wafers and stacked vertically in R.

The goal of the algorithm is to find a set of color weights $\overline{w}=[w^{(1)}\ w^{(2)} \ldots w^{(N)}]^T$ which minimize the residuals R (e.g., in a least squares sense), i.e., to obtain:

$$R\overline{w} = \overline{0}$$

$$\begin{bmatrix} r_1^{(1)} & r_1^{(2)} & \cdots & r_1^{(N)} \\ r_2^{(1)} & r_2^{(2)} & \cdots & r_2^{(N)} \\ r_3^{(2)} & r_3^{(2)} & \cdots & r_3^{(N)} \\ \vdots & \vdots & \ddots & \vdots \\ r_M^{(1)} & r_M^{(2)} & \cdots & r_M^{(N)} \end{bmatrix} \begin{bmatrix} w^{(1)} \\ w^{(2)} \\ \vdots \\ w^{(N)} \end{bmatrix} = \begin{bmatrix} 0 \\ 0 \\ \vdots \\ 0 \end{bmatrix}$$

As already stated, this system of equations can be solved, for example, via linear least squares regression under the additional constraint that the sum of color weights equals 1:

$$\sum_{n=1}^{N} w^{(n)} = 1$$

This constraint ensures that the determined aligned position correction is invariant to a translation in all of the colors, and also to avoid the trivial solution where all weights equal 0.

Once this system of equations is solved, applying the resulting optimal weights w to the alignment data will result in minimal model residuals (e.g., minimal root sum square/root mean square of model residuals) over the (set of) wafer(s) considered in the input. The weighting can be applied to alignment data so as to correct the alignment data for mark asymmetry when determining the alignment grid for future exposures.

The proposed method may be implemented as an external training algorithm in a similar manner to OCW. Alignment data from one or more wafers may be used as training data so as to determine a set of color weights, which can then be applied on one or more (future) wafers. However, the reliance on only alignment data without the need for reference overlay data also means that same method can be used to perform a per-wafer inline alignment correction; e.g., within a scanner or separate alignment station. Subsequent to all alignment marks having been measured (e.g., within a measurement stage of a twin stage system or a stand-alone alignment station), but before the wafer has been transferred to an exposure stage or exposure station, the proposed method may be used to determine a set of color weights which minimizes the model residuals for each wafer on a per-wafer basis. In this manner, the alignment grid for each wafer may be corrected with a set of optimal color weights specifically determined for that wafer.

In general, the set of color weights obtained using the methods described above will comprise non-zero values for every color. For example, some alignment sensors can measure with up to 24 illumination settings (e.g., 12 wavelengths and two polarizations), and as such the methods disclosed herein may determine 24 color weights.

In an embodiment, it may be advantageous to place a restriction on the number of color weights used in the solution, e.g., to restrict the number of colors used for a measurement (e.g., up to a maximum of 4, 5, 6 or 7 colors). Advantages of such an embodiment comprise more robustness against overfitting on outliers in the training data, and less strict requirements on the future wafers on which the recipe will be applied, since all colors with non-zero weight must also be valid (e.g., sufficient signal strength).

A first approach for reducing the number of color weights (which may be applied on its own or in combination with other such methods described herein) may comprise applying appropriate thresholds to exclude colors with very small associated weights, and/or remove colors that do not contribute significantly to the result (e.g., colors with an associated weight below a threshold may be excluded).

Figure 4:
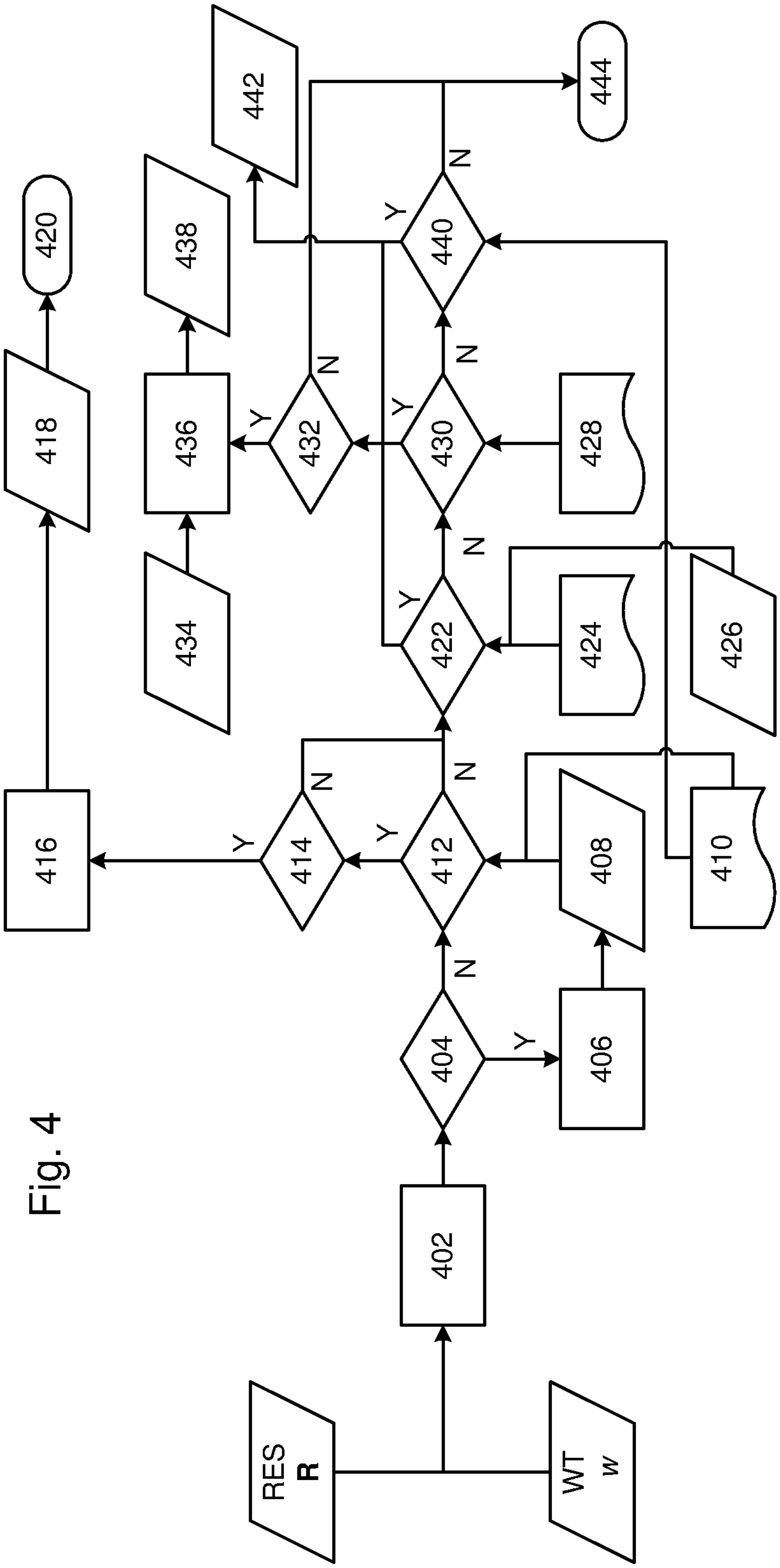
FIG. 4 is a flowchart of a color selection method in accordance with an embodiment of the invention.

FIG. 4 is a flowchart describing a method which may be used to reduce the number of colors (e.g., to determine a set of enabled colors for metrology as a subset of available colors). This describes a method to remove colors via a backward stepwise selection of predictors. Another approach would be to take forward stepwise selection, or a combination of both.

At step 402 a color impact metric and current performance metric is determined from residuals (RES) R and weights (WT) w. The current performance may be determined from the regression error (e.g., the square root of the regression error: $\sqrt{(R\overline{w})^T(R\overline{w})}$). The color impact metric may be constructed by multiplying each color (column) of the residual matrix by the corresponding color weight. Based on this, the RMS (or other suitable statistical measure) per color can be determined, resulting in a color impact vector with a value per color.

The method described by the flowchart can be repeated over a number of runs, e.g., potentially removing a color at a time. At step 404, it is determined whether this is a first run and if so the current performance metric determined in the previous step is used to initialize 406 a start performance metric 408. At step 412, it is determined whether the difference between the current performance metric and start performance metric 408 is outside of a performance threshold 410: if so it is then determined 414 whether the previous run resulted in color being removed based on performance. If so, the algorithm reverts 416 to the weights from the previous run 418 and ends 420 with these weights and present enabled colors.

If either of step 412, 414 are negative, at step 422, it is determined whether the present number 426 of enabled colors is greater than a designated maximum 424 number of enabled colors. If not, at step 430, it is determined whether any of the weights has a magnitude below a minimum weight threshold 428. If not, at step 440 it is determined whether the difference between the current performance metric and start performance metric 408 is within the performance threshold 410. If not, the process ends 444 with the current weights and enabled colors.

If, for any of steps 422, 430, 440, the determination is yes, than the present weights for this run are stored 442 and at step 432 it is determined whether the number of colors is greater than 1. If not, the process ends 444 with the current weights. If so, based on the present enabled colors 434, the color with the lowest associated color impact is removed, to determine an updated set of enabled colors 438. A further run can then be performed based on the updated enabled colors 438 and its associated weights 442.

Another approach to reduce the number of colors may comprise a brute force approach in which all color combinations are considered and the best combination selected (e.g., the combination which satisfies all conditions). More specifically the method may comprise calculate the solution for each possible set of color weights. This may comprise beginning with all 1-color solutions, then all 2-color solutions, then all 3-color solutions, up to all color solutions. The optimal solution may be the solution meeting a certain performance threshold using the fewest number of colors.

In an embodiment, the disclosed method of optimizing on residuals can also be combined (in a number of various ways which will apparent to the skilled person) with an optimization on overlay; e.g., to combine the method with an OCW method. For example, when only a small number of overlay wafers are available, the optimization may be performed on the alignment residuals only, as described. Later, once sufficient overlay wafers are available, the method may smoothly transition to optimizing on the overlay data instead (e.g., the difference between alignment and overlay data). Alternatively, or in addition the overlay data may be used to perform a co-optimization between minimizing residuals and the difference between alignment and overlay data.

The advantages of the methods disclosed herein is that no overlay training data is required. Furthermore, in in-line embodiments, wafer alignment data can be corrected faster compared to correction based on overlay training wafers because the alignment data is available directly after the exposure. Thus any change in process which requires re-training of the weights can be more quickly detected and addressed. In addition, this multi-color lowest residual method shows a significant performance gain (in terms of improved overlay performance) compared to a single-color residual approach and overlay-trained OCW methods.

While the above concepts are described in terms of wafer alignment, they are applicable to other metrology aspects such as overlay metrology. Overlay targets also suffer from the same issues (undesired asymmetries) and overlay measurements corrected based on multiple color measurements. As such, the methods described above are directly applicable to such overlay measurements, where the residuals are overlay residual obtained by fitting of an overlay model to per-color overlay data.

As such, the concepts disclosed herein may be generalized to determining a set of color weights (or illumination setting weights, where an illumination setting is a combination of a measurement wavelength and polarization) for correction of multiple color/illumination setting metrology data by minimizing model residuals in terms of the weights, the model residuals being obtained from a fitting of the metrology data to a model for representing the metrology data.

A further embodiment will now be described, which applies to a metrology tool (e.g., an alignment sensor) comprising an SRI (or phase channel) as has been described, and additional intensity channels. The embodiment will be described in terms of intensity asymmetry measurements using such intensity channels. However, it may be appreciated that this embodiment may use any supplementary metrology data or supplementary metrology parameter indicative of a nuisance component in the alignment data (e.g., due to mark asymmetry). The supplementary metrology data may be supplementary to and/or correspond to the alignment data, and may (for example) be measured simultaneously with said alignment data, The SRI measures a phase difference between a pair of complementary diffraction orders for a plurality of wavelengths from a target and therefore an aligned position including any mark deformation error for each of the wavelengths (the mark deformation error causing a per-wavelength aligned position variation). The intensity channel, simultaneously with the SRI phase measurement, measures the intensity of each of the pair of complementary diffraction orders from the mark, and therefore a (e.g., optionally normalized) difference between these diffraction orders indicative of the mark deformation error component only. As such, the intensity channel output can be used to correct the aligned position for mark deformation error.

More specifically, the complex electric fields of the −1 and +1 diffraction order $E_{-}(\omega), E_{+}(\omega)$ are described by $$E_{-}(\omega)=\sqrt{I_{-}(\omega)}\exp i\varphi_{-}(\omega)$$

$$E_{+}(\omega)=\sqrt{I_{+}(\omega)}\exp i\varphi_{+}(\omega)$$

where ω is the angular frequency (=2πc/λ).

The measured position $x_{meas}(\omega)$ (including mark deformation error), as measured using the SRI (phase channel), may be described by:

$$x_{meas}(\omega) = \frac{P}{4\pi}\cdot(\varphi_{+}(\omega)-\varphi(\omega))$$

where P is the target/mark pitch and $\varphi_{+}(\omega)-\varphi_{-}(\omega)$ is the phase difference between the +1 and −1 diffraction orders. The measured (normalized) intensity asymmetry $Q_{meas}(\omega)$ indicative of the mark deformation error only may be described by:

$$Q_{meas}(\omega) = \frac{I_{+}(\omega)-I_{-}(\omega)}{I_{+}(\omega)+I_{-}(\omega)}$$

where $I_{+}(\omega)$ is the intensity of the +1 diffraction order and $I_{-}(\omega)$ diffraction order.

It is now proposed that the color weighting method disclosed herein be extended to include an additional color weighting for the intensity channel output. Such a method may comprise determining a first set of weights $w^{(n)}$ for the position measurements (as before) while simultaneously determining a second set of weights $v^{(n)}$ (intensity asymmetry weights) for the intensity asymmetry measurements $Q_{meas}^{(n)}$. As such, the weights $w^{(n)}, v^{(n)}$ may be such that the actual aligned position x can be found by:

$$x = \sum_{n=1}^{N} w^{(n)} x_{meas}^{(n)} + v^{(n)} Q_{meas}^{(n)}$$

As before, the additional constraint that weights $w^{(n)}$ sum to 1 may be applied. Note that this applies to the alignment data weights only, no such constraint is imposed on the intensity asymmetry weights. This is because the aligned position x which results from the weighting should be insensitive to a position shift delta Δ in all colors (because this corresponds to a true position, mechanical, shift of the mark on the wafer):

$$x + \Delta = \sum_{n=1}^{N} w^{(n)}\left(x_{meas}^{(n)} + \Delta\right) + v^{(n)} Q_{meas}^{(n)}$$

From this equation, the constraint that the sum of the phase-channel weights should equal 1 follows immediately. Because the intensity asymmetry measurements $$Q_{meas}^{(n)}$$

are not dependent on the position of the mark itself, the constraint does not apply there.

The implementation of this method may comprise determining the set of color weights $\overline{w}_I=[w^{(1)}\ w^{(2)}\ \ldots\ w^{(N)}\ v^{(1)}\ v^{(2)}\ \ldots\ v^{(N)}]$ which minimize the residuals $R_I$ (e.g., in a least squares sense):

$$R_I\overline{w}_I = \overline{0}$$

$$\begin{bmatrix} r_1^{(1)} & r_1^{(2)} & \cdots & r_1^{(N)} & r_1^{I,(1)} & r_1^{I,(2)} & \cdots & r_1^{I,(N)} \\ r_2^{(1)} & r_2^{(2)} & \cdots & r_2^{(N)} & r_2^{I,(1)} & r_2^{I,(2)} & \cdots & r_2^{I,(N)} \\ r_3^{(2)} & r_3^{(2)} & \cdots & r_3^{(N)} & r_3^{I,(2)} & r_3^{I,(2)} & \cdots & r_3^{I,(N)} \\ \vdots & \vdots & \ddots & \vdots & \vdots & \vdots & \ddots & \vdots \\ R_M^{(1)} & r_M^{(2)} & \cdots & r_M^{(N)} & r_M^{I,(1)} & r_M^{I,(2)} & \cdots & r_M^{I,(N)} \end{bmatrix} \begin{bmatrix} w^{(1)} \\ w^{(2)} \\ \vdots \\ w^{(N)} \\ v^{(1)} \\ v^{(2)} \\ \vdots \\ v^{(N)} \end{bmatrix} = \begin{bmatrix} 0 \\ 0 \\ \vdots \\ 0 \\ 0 \\ 0 \\ \vdots \\ 0 \end{bmatrix}$$

where $$r_1^{I,(1)} - r_M^{I,(N)}$$

are the intensity asymmetry model fit residuals. As before, m is the alignment mark index (where m=1 to M) and n is the color channel index (where n=1 to N). The basic methodology is the same as the previous embodiment without intensity asymmetry weighting.

While specific embodiments of the invention have been described above, it will be appreciated that the invention may be practiced otherwise than as described.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

Embodiments of the present disclosure can be further described by the following clauses.

1. A method for determining a set of correction weights to correct metrology data; the method comprising:
obtaining first metrology data relating to a plurality of illumination settings of measurement radiation used to perform a measurement, where each illumination setting comprises a different wavelength, polarization or combination thereof;
fitting the metrology data to a model for representing the metrology data and determining the fit residuals;
determining said correction weights as correction weights which minimize the fit residuals.

2. A method as in clause 1, wherein said fitting step comprising fitting the metrology data per illumination setting with said model, and recording the fit residuals for each illumination setting.

3. A method as in clause 1 or 2, wherein said determining step comprises an optimization of the correction weights which minimize a residual matrix comprising said metrology data arranged per target or mark in a first dimension and per color in a second dimension.

4. A method as in clause 3, wherein said optimization comprises a least squares optimization.

5. A method as in any preceding clause, wherein said correction weights comprise a correction weight for each of said plurality of illumination settings.

6. A method as in any preceding clause, further comprising determining a preferred subset of said plurality of illumination settings.

7. A method as in clause 6, wherein said step of determining a preferred subset comprises:
evaluating a candidate combination of illumination settings in terms of a performance metric and an impact metric; and
removing or adding an illumination setting to said candidate combination of illumination settings based in said performance metric and impact metric.

8. A method as in clause 7, wherein said removing or adding step comprises removing an illumination condition having a lowest impact metric provided that a performance threshold is met to obtain an updated candidate combination of illumination settings.

9. A method as in clause 7 or 8, comprising performing said evaluating and removing or adding steps until said candidate combination of illumination settings comprises a desired number of illumination settings.

10. A method as in clause 6, wherein said step of determining a preferred subset comprises
evaluating all possible combinations of illumination settings; and
selecting said preferred subset as the combination of illumination settings which meets a performance threshold using the fewest number of illumination settings.

11. A method as in any preceding clause, comprising removing any illumination setting for which the determined correction weight is below a significance threshold.

12. A method as in any preceding clause, wherein said determination step is constrained such that the sum of the correction weights equals one.

13. A method as in any preceding clause, wherein said metrology data comprises alignment data.

14. A method as in clause 13, comprising applying said correction weights to an alignment measurement of a substrate performed with a plurality of illumination settings to obtain a corrected alignment measurement.

15. A method as in clause 13, wherein said metrology data further comprises supplementary metrology data corresponding to said alignment data, said supplementary metrology data relating to a supplementary metrology parameter; and the method further comprises:
simultaneously fitting the alignment data to a first model for representing the alignment data and determining alignment data fit residuals, and fitting the supplementary metrology data to a second model for representing the supplementary metrology data and determining the supplementary metrology data fit residuals; and
determining said correction weights as a first set of correction weights which minimize the alignment fit residuals and a second set of correction weights which minimize the supplementary metrology data fit residuals.

16. A method as in clause 15, wherein said supplementary metrology data is indicative of a nuisance component in the alignment data.

17. A method as in clause 15 or 16, wherein said supplementary metrology data is indicative of asymmetry in one or more targets or marks measured to obtain said alignment data and supplementary metrology data.

18. A method as in clause 17, wherein said supplementary metrology parameter comprises intensity asymmetry relating to a difference or imbalance in a pair of complementary diffraction orders from said one or more targets or marks.

19. A method as in any of clauses 15 to 18, comprising:
applying said first correction weights to an alignment measurement of a substrate performed with a plurality of illumination settings to obtain a weighted alignment measurement;
applying said second correction weights to a supplementary metrology parameter measurement corresponding to said alignment measurement to obtain a weighted supplementary metrology parameter measurement; and
determining a corrected alignment measurement from said weighted alignment measurement and weighted supplementary metrology parameter measurement.

20. A method as in clause 14 or 19, comprising performing said alignment measurement.

21. A method as in any of clauses 13 to 20, wherein the method is performed to determine said correction weights in an initial training phase using training substrates, said determined correction weights being for application to a plurality of subsequent substrates.

22. A method as in any of clauses 13 to 20, wherein said method is performed between performance of an alignment metrology step and a lithographic exposure step;
wherein said alignment metrology step is performed to obtain said alignment measurement such that said first alignment data comprises said alignment measurement, and the method further comprises: performing the lithographic exposure step using the alignment measurement as corrected by application of the determined correction weights.

23. A method as in clause 22, wherein said alignment weights are determined individually for each substrate prior to each exposure step.

24. A method as in any of clauses 13 to 23, wherein the method comprises, when an amount of overlay data available reaches a threshold, transitioning to an optimization based on minimizing a difference between said overlay data and said alignment data.

25. A method as in any of clauses 13 to 24, wherein said determining said correction weights comprises performing a co-optimization between said minimizing fit residuals and minimizing the difference between overlay data and said alignment data.

26. A method as in any of clauses 1 to 12, wherein said metrology data comprises overlay data.

27. A computer program comprising program instructions operable to perform the method of any of clauses 1 to 26, when run on a suitable apparatus.

28. A non-transient computer program carrier comprising the computer program of clause 27.

29. A processing system comprising a processor and a storage device comprising the computer program of clause 28.

30. An alignment sensor operable to perform the method of any of clauses 13 to 23.

31. A lithographic apparatus comprising:

a patterning device support for supporting a patterning device;

a substrate support for supporting a substrate; and the alignment sensor of clause 30.

32. A metrology device operable to perform the method of clause 26.

The breadth and scope of the present invention should not be limited by any of the above-described exemplary embodiments, but should be defined only in accordance with the following claims and their equivalents.

The invention claimed is:

1. A method comprising:

obtaining first metrology data relating to a plurality of illumination settings of measurement radiation used to perform a measurement, where each illumination setting comprises a different wavelength, polarization or combination thereof;

fitting, by a hardware computer system, the metrology data to a model for representing the metrology data and determining fit residuals;

determining a correction weight to correct metrology data which minimizes the fit residuals; and physically configuring a patterning process based on the correction weight and/or providing a physical signal representing, or based on, the correction weight to a system for use in configuration of the patterning process.

2. The method as claimed in claim 1, wherein the fitting comprises fitting the metrology data per illumination setting with the model, and recording the fit residuals for each illumination setting.

3. The method as claimed in claim 1, wherein the determining comprises an optimization of the correction weight which minimizes a residual matrix comprising the metrology data arranged per target or mark in a first dimension and per color in a second dimension.

4. The method as claimed in claim 1, further comprising determining a preferred subset of the plurality of illumination settings.

5. The method as claimed in claim 4, wherein the determining a preferred subset comprises:

evaluating a candidate combination of illumination settings in terms of a performance metric and an impact metric; and removing or adding an illumination setting to the candidate combination of illumination settings based on the performance metric and impact metric.

6. The method as claimed in claim 5, wherein the removing or adding comprises removing an illumination condition having a lowest impact metric provided that a performance threshold is met to obtain an updated candidate combination of illumination settings.

7. The method as claimed in claim 6, wherein the determining a preferred subset comprises:

evaluating all possible combinations of illumination settings; and selecting the preferred subset as the combination of illumination settings which meets a performance threshold using the fewest number of illumination settings.

8. The method as claimed in claim 1, wherein the metrology data comprises alignment data.

9. The method as claimed in claim 8, wherein the configuring the patterning process and/or providing the signal comprises applying the correction weight to an alignment measurement of a substrate performed with a plurality of illumination settings to obtain a corrected alignment measurement.

10. The method as claimed in claim 8, wherein the metrology data further comprises supplementary metrology data corresponding to the alignment data, the supplementary metrology data relating to a supplementary metrology parameter; and the method further comprises:

simultaneously fitting the alignment data to a first model for representing the alignment data and determining alignment data fit residuals, and fitting the supplementary metrology data to a second model for representing the supplementary metrology data and determining supplementary metrology data fit residuals; and determining the correction weight as a first set of one or more correction weights which minimize the alignment fit residuals and a second set of one or more correction weights which minimize the supplementary metrology data fit residuals.

11. The method as claimed in claim 10, wherein the supplementary metrology data is indicative of asymmetry in one or more targets or marks measured to obtain the alignment data and supplementary metrology data.

12. The method as claimed in claim 10, wherein the configuring the patterning process and/or providing the signal comprises:

applying the first set of one or more correction weights to an alignment measurement of a substrate performed with a plurality of illumination settings to obtain a weighted alignment measurement;

applying the second set of one or more correction weights to a supplementary metrology parameter measurement corresponding to the alignment measurement to obtain a weighted supplementary metrology parameter measurement; and determining a corrected alignment measurement from the weighted alignment measurement and weighted supplementary metrology parameter measurement.

13. The method as claimed in claim 8, wherein the method is performed between performance of an alignment metrology step and a lithographic exposure step;

wherein the alignment metrology step is performed to obtain an alignment measurement such that the alignment data comprises the alignment measurement, and wherein the configuring the patterning process and/or providing the signal comprises performing the lithographic exposure step using the alignment measurement as corrected by application of the determined correction weight.

14. The method as claimed in claim 8, further comprising, when an amount of overlay data available reaches a threshold, transitioning to an optimization based on minimizing a difference between the overlay data and the alignment data.

15. The method as claimed in claim 8, wherein the determining the correction weight comprises performing a co-optimization between minimizing fit residuals and minimizing a difference between overlay data and the alignment data.

16. An alignment sensor configured to perform the method of claim 8.

17. A lithographic apparatus comprising:

a patterning device support configured to support a patterning device;

a substrate support configured to support a substrate; and the alignment sensor of claim 16.

18. The method as claimed in claim 1, wherein the metrology data comprises overlay data.

19. A metrology device configured to perform the method of claim 18.

20. A non-transitory computer program carrier comprising a computer program stored therein, the computer program, when executed, configured to cause a computer system to at least:

obtain first metrology data relating to a plurality of illumination settings of measurement radiation used to perform a measurement, where each illumination setting comprises a different wavelength, polarization or combination thereof;

fit the metrology data to a model for representing the metrology data and determining fit residuals;

determine a correction weight to correct metrology data which minimizes the fit residuals; and cause physical configuration of a patterning process based on the correction weight and/or provide a physical signal representing, or based on, the correction weight to a system for use in configuration of the patterning process.

* * * * *